United States Patent
Thalmann

(10) Patent No.: US 7,039,544 B2
(45) Date of Patent: May 2, 2006

(54) METHOD FOR TESTING CIRCUIT UNITS TO BE TESTED AND TEST APPARATUS

(75) Inventor: Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/946,660

(22) Filed: Sep. 22, 2004

(65) Prior Publication Data

US 2005/0075821 A1  Apr. 7, 2005

(30) Foreign Application Priority Data

Oct. 2, 2003  (DE) .................................. 103 45 979

(51) Int. Cl.
*G06F 11/32* (2006.01)
(52) U.S. Cl. .................... 702/118; 324/512; 709/217
(58) Field of Classification Search ................ 702/118, 702/117, 182–185, 188; 324/500, 512; 709/213, 709/217, 238
See application file for complete search history.

(56) References Cited

U.S. PATENT DOCUMENTS 6,028,439 A * 2/2000 Arkin et al. ................. 324/765
6,446,228 B1  9/2002 Kobayashi ................... 714/724

FOREIGN PATENT DOCUMENTS

DE  42 32 735 A1  4/1993
JP  DE 199 37 820 C2  3/2000

* cited by examiner

*Primary Examiner*—Edward Raymond
(74) *Attorney, Agent, or Firm*—Jenkins, Wilson, Taylor & Hunt, P.A.

(57) ABSTRACT

The invention provides a test apparatus for testing circuit units ($101a$–$101k$) to be tested by means of a test system (100), having a connection device (102), tester channels ($103a$–$103m$) for connecting the test system (100) to the connection device (102) and receptacle units ($104a$–$104k$), having a number ($n_1, n_2, \ldots, n_k$) of circuit unit data channels dependent on the circuit units (101–$101k$) to be tested, provision being made of a changeover device (200) for changing over the tester channels ($103a$–$103m$) to the receptacle units ($104a$–$104k$), and it being possible to divide a number (m) of tester channels ($103a$–$103m$) between the number ($n_1, n_2, \ldots, n_k$) of circuit unit data channels in a predeterminable manner.

12 Claims, 2 Drawing Sheets

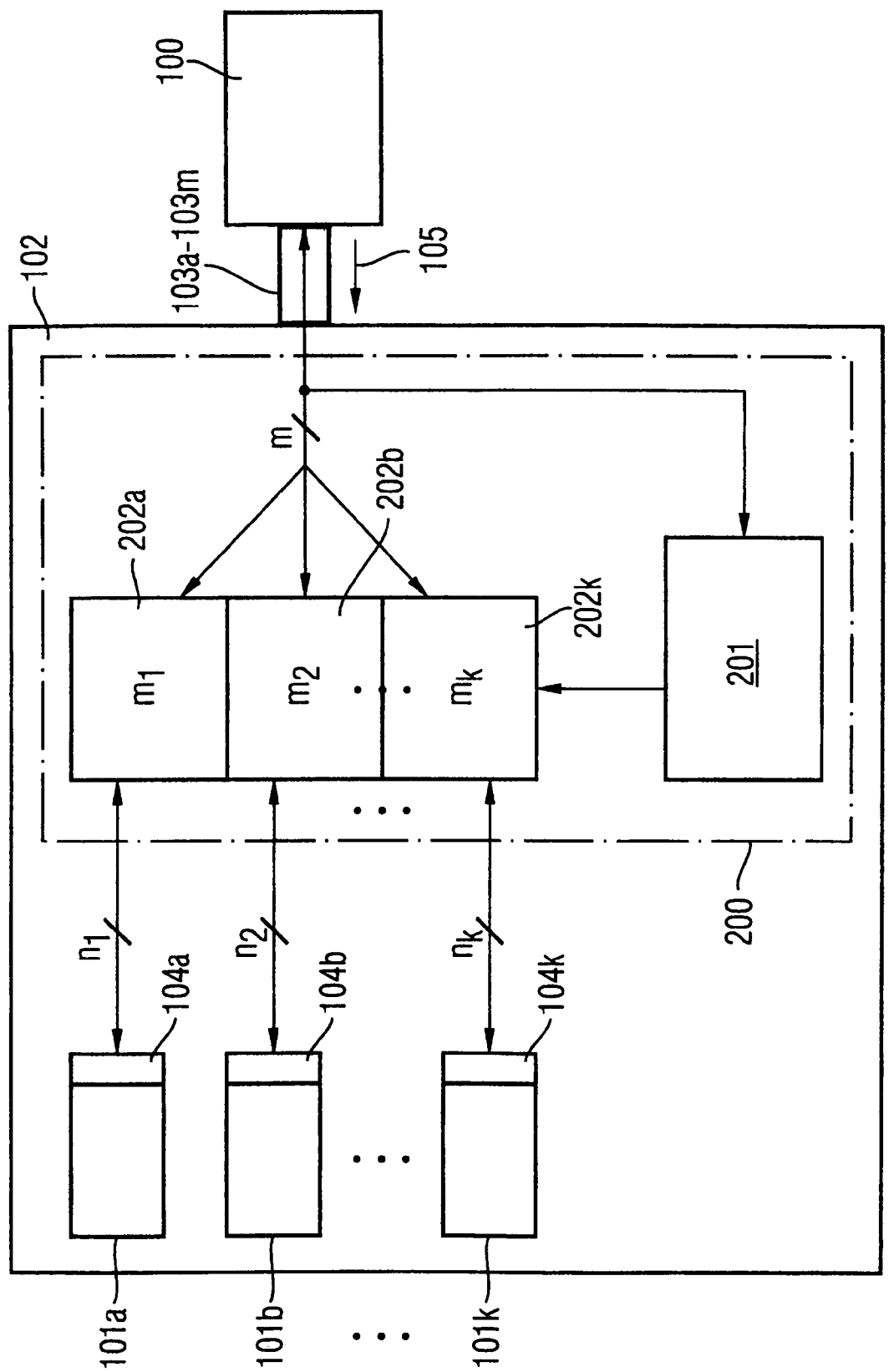

METHOD FOR TESTING CIRCUIT UNITS TO BE TESTED AND TEST APPARATUS

Figure 1:
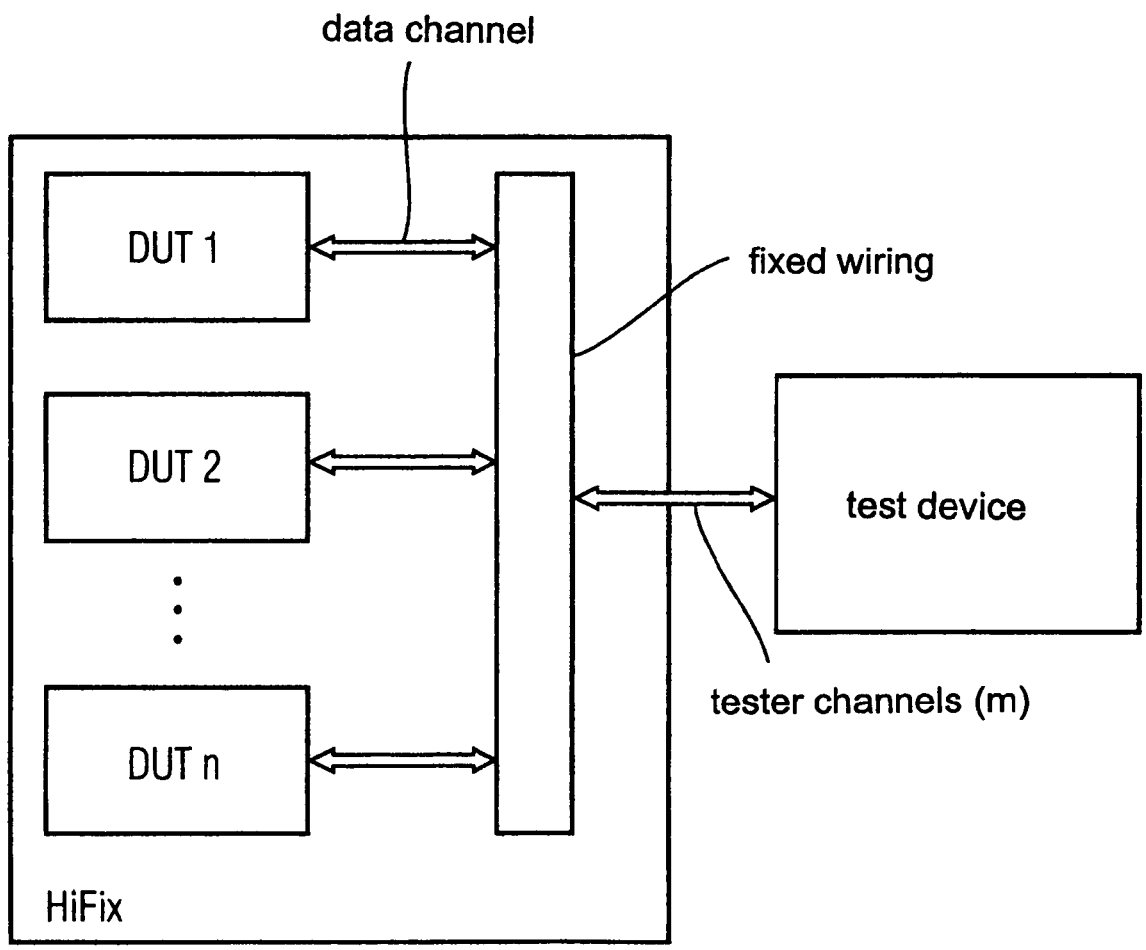

The present invention generally relates to a test method for testing circuit units to be tested and a test apparatus having connection devices for the connection of the circuit units to be tested.

In particular, the present invention relates to a test apparatus for testing circuit units to be tested by means of a test system, the test apparatus comprising a connection device, tester channels for connecting the test system to the connection device and for transmitting test data, and receptacle units, having a number of circuit unit data channels dependent on the circuit units to be tested, for the fitting of the circuit units to be tested to and for the electrical connection of the circuit units to be tested to the connection device.

A conventional test apparatus of this type is shown in FIG. 1. The apparatus shown in FIG. 1 comprises a test device that is connected via tester channels (m) to a connection device, usually referred to as HiFix. The test device transmits test data to the connection device and/or receives test result data from the connection device.

Receptacle units are fitted on the connection device, it being possible to fit circuit units to be tested, DUT (Device Under Test), into said receptacle units. In order that each of the circuit units to be tested can be supplied with test data, the tester channels (m) are conventionally divided between the circuit units to be tested. In the conventional example of a test apparatus as shown in FIG. 1, a number of n circuit units DUT1, DUT2, DUT3, . . . , DUTn to be tested are fitted on the connection device. A device for the fixed wiring of the tester channels to the data channels that in each case lead to the circuit units to be tested is likewise provided on the connection device.

The circuit units DUT1–DUTn to be tested are tested with the aid of a test data stream or with the aid of test data in order to verify their functionality. In order to lower test costs, it is necessary to maximize a parallelism when testing circuit units to be tested. In the conventional apparatus shown in FIG. 1, a maximum parallelism when testing circuit units to be tested is achieved when all of the tester channels of a number m are utilized.

It is disadvantageous that a division of the tester channels between the receptacle units (not shown) on which the circuit units to be tested are fitted is fixedly wired or fixedly predetermined. Circuit units to be tested usually have a different number of data channels in such a way that, in an unfavorable case, not all of the data channels that are provided by the receptacle unit can be utilized by the circuit unit to be tested.

In this way, tester channels are lost and an optimum parallelism when testing circuit units to be tested cannot be achieved. In this way, a test time is lengthened and, consequently, the test costs are increased. It is disadvantageous that each data channel must comprise such a number of lines which corresponds to that circuit unit to be tested which requires the largest number of data channels.

It is disadvantageous that, with the conventional connection device, only a number of M/N circuit units can be tested in parallel if the maximum number of data channels to be provided for a circuit unit to be tested is n.

In particular, in the case of memory modules, a distinction is made between different organizations and memory sizes. In this case, an organization determines a number of data lines, the address space being determined by the memory size. What is critical in this case is that the number of connection pins, i.e. thus the number of data channels, may change for different memory modules or for different circuit units to be tested.

It is disadvantageous that the conventional connection devices are fixedly wired. The available tester channels (m) are then fixedly assigned to the circuit units DUT1–DUTn to be tested. Such a fixed assignment results in the disadvantage that when more data channels are required for a circuit unit to be tested, the fixedly wired connection device can no longer be used.

It is disadvantageous that additional test costs arise since a further connection device has to be provided. Furthermore, it is inexpedient that when fewer than a maximum provided number of data channels per chip are required, the maximum number of circuit units to be tested which can be tested in parallel is then not utilized. The test costs rise as a result of this since a parallelism is reduced.

DE 101 50 441 A1 describes a conventional method for testing circuit units to be tested. In this case, a plurality of identical circuit units to be tested are tested in a particularly rapid yet reliable manner, in such a way that the plurality of circuit units to be tested are tested in parallel and essentially simultaneously, in which case a test device's driver lines that are used here to the circuit units to be tested are used simultaneously and jointly for all of the circuit units to be tested.

In this case, the test results have to be read out from a plurality of input-output channels in a compressed manner, the circuit units to be tested further having to be assigned to at least one stack and be connected up.

It is disadvantageous that, in the case of the test apparatus proposed in DE 101 50 441 A1, identical data lines are used for different chips. It is disadvantageous that the circuit units to be tested cannot be completely tested thoroughly by means of data lines that are used jointly for a plurality of circuit units to be tested, since data signal collisions can occur when writing and/or reading out the data to and/or from the circuit units to be tested.

Consequently, it is an object of the present invention to provide a test apparatus which optimally utilizes existing tester channels and increases a parallelism when testing circuit units to be tested.

This object is achieved according to the invention by means of a test apparatus having the features of patent claim 1.

Furthermore, the object is achieved by means of a method specified in patent claim 7.

Further refinements of the invention emerge from the subclaims.

An essential concept of the invention consists in providing a changeover unit on a connection device that serves for connecting circuit units to be tested to a test system, said changeover unit enabling tester channels to be flexibly assigned to the circuit units to be tested. In this case, a flexible switching network by means of which the tester channels can be distributed as desired between the circuit units to be tested is provided in the connection device.

For the circuit units to be tested, only a number of absolutely required tester channels are provided, in such a way that a maximum parallelism is achieved. The heart of the invention is the provision of a flexible linking element between a test system and a number of circuit units to be tested, said linking element being configurable by the test system by means of a test mode signal.

Consequently, it is an advantage of the present invention that a reconfigurability of the connection device makes it possible to save hardware costs. Furthermore, it is expedient that a parallelism when testing circuit units to be tested is increased in such a way that the test costs are lowered.

The test apparatus according to the invention for testing circuit units to be tested by means of a test system essentially has:

a) a connection device;
b) tester channels for connecting the test system to the connection device and for transmitting test data; and
c) receptacle units, having a number of circuit unit data channels dependent on the circuit units to be tested, for the fitting of the circuit units to be tested and for the electrical connection of the circuit units to be tested to the connection device, the connection device having a changeover device for changing over the tester channels to the receptacle units, it being possible to divide a number of tester channels between the number of circuit unit data channels in a predeterminable manner depending on a test mode signal fed via the tester channel.

Furthermore, the method according to the invention for testing circuit units to be tested by means of a test system essentially has the following steps:

a) provision of a connection device for the connection of the circuit units to be tested;
b) connection of the test system to the connection device via tester channels;
c) fitting of the circuit units to be tested, which have a number of circuit unit data channels, to and electrical connection of the circuit units to be tested to the connection device; and
d) transmission of test data between the test system and the connection device, a number of tester channels being divided between the number of circuit unit data channels by means of a changeover device in a predeterminable manner depending on a test mode signal fed via a tester channel.

Advantageous developments and improvements of the respective subject matter of the invention are found in the subclaims.

In accordance with one preferred development of the present invention, the changeover device for changing over the tester channels to the receptacle units has connecting units for dividing the number of tester channels into subgroups of predeterminable numbers of subgroup data channels.

In accordance with yet another preferred development of the present invention, the changeover device for changing over the tester channels to the receptacle units further has a control unit for driving the connecting units in a manner dependent on a test mode signal of the test system, the connecting units being freely configurable for the circuit units to be tested.

In accordance with yet another preferred development of the present invention, the receptacle units having the number of circuit unit data channels dependent on the circuit units to be tested are provided in a manner integrated with the connection device.

In accordance with yet another preferred development of the present invention, the numbers of subgroup data channels in each case correspond to the numbers of circuit unit data channels, preferably for each of the circuit units to be tested.

It is furthermore an advantage that the number of tester channels corresponds to the sum of the numbers of subgroup data channels. This advantageously achieves a maximization of a parallelism when testing the circuit units to be tested.

In accordance with yet another preferred development of the present invention, the changeover device is configured by means of a test mode signal provided by the test system.

In accordance with yet another preferred development of the present invention, a partitioning of the number of tester channels is carried out in the control unit of the changeover device.

Exemplary embodiments of the invention are illustrated in the drawings and are explained in more detail in the description below.

In the drawings:

FIG. 1 shows a conventional apparatus for testing circuit units to be tested; and FIG. 2 shows a block diagram of a test apparatus according to the invention, which comprises a connection device with a changeover device provided therein, in accordance with a preferred exemplary embodiment of the present invention.

DETAILED DESCRIPTION OF THE INVENTION

In the figures, identical reference symbols designate identical or functionally identical components or steps.

FIG. 2 illustrates a block diagram of a test apparatus in accordance with a preferred exemplary embodiment of the present invention. A reference symbol 100 designates a test system that provides the test data 105 required for testing circuit units 101$a$–101$k$ to be tested.

The test result signals (not shown) supplied by the circuit units 101$a$–101$k$ to be tested in a manner dependent on the test data 105 that are fed are subsequently analyzed in the test system 100, as a result of which it is possible to determine whether a specific circuit unit 101$a$–101$k$ to be tested is free of defects or defective.

The test system 100 is connected to a connection device 102 via tester channels 103$a$–103$n$. The connection device 102 has receptacle units 104$a$–104$k$ on which the circuit units 101$a$–101$k$ to be tested can be fitted. Furthermore, the connection device 102 has a changeover device 200 designated by a broken line. All of the tester channels 103$a$–103$m$ that connect the test system 100 to the connection device 102 are fed to the changeover device.

The circuit units 101$a$–101$k$ to be tested, or the receptacle units 104$a$–104$k$ on which the circuit units 101$a$–101$k$ to be tested are fitted, in each case have a, generally mutually different, number of circuit unit data channels $n_1, n_2, \ldots n_k$. In this case, the total number of circuit unit data channels $n_1+n_2+ \ldots +n_k$ of all the circuit units 101$a$–101$k$ to be tested may preferably correspond to the total number of m tester channels 103$a$–103$m$ provided.

The changeover device 200 according to the invention now has the task of dividing the number m of available tester channels optimally between the circuit units 101$a$–101$k$ to be tested or between the receptacle units 104$a$–104$k$ thereof.

For this purpose, the changeover device 200 comprises a control unit 201 and connecting units 202$a$–202$k$. The connecting units 202$a$–202$k$ are freely configurable in a manner dependent on a control signal supplied by the control unit 201. The number of the connecting units 202$a$–202$k$ preferably corresponds to the number of circuit units 101$a$–101$k$ to be tested and is k.

It should be pointed out, however, that the number of circuit units 101$a$–101$k$ to be tested or the number of receptacle units 104$a$–104$n$ may differ from the number of connecting units 202$a$–202$k$. An optimum parallelism when testing circuit units 101a–101k to be tested is achieved, however, only when the numbers are identical.

Preferably, the connecting units 202a–202k are configured in such a way that the total number m of tester channels 103a–103m is completely divided into a number of subgroup data channels $m_1, m_2, \ldots, m_k$. In this case, the respective numbers $m_1$–$m_k$ of subgroup data channels and the respective numbers $n_1$–$n_k$ of circuit unit data channels preferably correspond to one another. In this case, the sum of all the subgroup data channels $m_1+m_2+\ldots, m_k$ preferably corresponds to the total number of m tester channels 103a–103m that are available.

Preferably, the partitioning of the total number m of available tester channels 103a–103m into subgroup data channels is carried out by means of the changeover device 200 in a manner dependent on a test mode signal 106 fed by the test system 100.

With regard to the conventional test apparatus illustrated in FIG. 1, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

LIST OF REFERENCE SYMBOLS

In the figures, identical reference symbols designate identical or functionally identical components or steps.
100 test system
101a–101k circuit to be tested
102 connection device (HiFix)
103, 103a–103m tester channel
104a–104n receptacle unit
105 test data
106 test mode signal
200 changeover device
201 control unit
202a–202k connecting unit
$m_1, m_2, \ldots, m_k$ number of subgroup data channels
$n_1, n_2, \ldots, n_k$ number of circuit unit data channels

What is claimed is:

1. Test apparatus for testing circuit units to be tested by means of a test system, having:
    a) a connection device;
    b) tester channels for connecting the test system to the connection device and for transmitting test data; and
    c) receptacle units, having a number of circuit unit data channels dependent on the circuit units to be tested, for the fitting of the circuit units to be tested and for the electrical connection of the circuit units to be tested to the connection device,
    wherein the connection device further has:
    d) a changeover device for changing over the tester channels to the receptacle units, it being possible to divide a number of tester channels between the number of circuit unit data channels in a predeterminable manner depending on a test mode signal fed via the tester channel, wherein the changeover device further has connecting units for dividing the number of tester channels into subgroups of predeterminable numbers of subgroup data channels.

2. Apparatus according to claim 1, wherein the changeover device for changing over the tester channels to the receptacle units further has a control unit for driving the connecting units in a manner dependent on a test mode signal of the test system, the connecting units being freely configurable for the circuit units to be tested.

3. Apparatus according to claim 1, wherein the receptacle units having the number of circuit unit data channels dependent on the circuit units to be tested are provided in a manner integrated with the connection device.

4. Apparatus according to claim 1, wherein the numbers of subgroup data channels in each case correspond to the numbers of circuit unit data channels.

5. Apparatus according to claim 1, wherein the number of tester channels corresponds to the sum of the numbers of subgroup data channels.

6. Method for testing circuit units to be tested by means of a test system, having the following steps:
    a) providing of a connection device for the connection of the circuit units to be tested;
    b) connecting of the test system to the connection device via tester channels;
    c) fitting of the circuit units to be tested, which have a number of circuit unit data channels, to an electrical connection of the circuit units to be tested to the connection device; and
    d) transmitting test data between the test system and the connection device,
    wherein a number of tester channels are divided between the number of circuit unit data channels by means of a changeover device in a predeterminable manner depending on a test mode signal fed via a tester channel, and further wherein the number of tester channels is divided into the subgroups of predeterminable numbers of subgroup data channels by means of connecting units provided in the changeover device for changing over the tester channels to receptacle units.

7. Method according to claim 6, wherein the tester channels are changed over to the receptacle units by means of the changeover device.

8. Method according to claim 6, wherein the connecting units are driven in a manner dependent on a test mode signal of the test system by means of a control unit provided in the changeover device for changing over the tester channels to the receptacle units in such a way that the connecting units are freely configured for the circuit units to be tested.

9. Method according to claim 6, wherein the numbers of subgroup data channels in each case correspond to the numbers of circuit unit data channels.

10. Method according to claim 6, wherein the number of tester channels corresponds to the sum of the numbers of subgroup data channels.

11. Method according to claim 6, wherein the changeover device is configured by means of a test mode signal provided by the test system.

12. Method according to claim 8, wherein a partitioning of the number of tester channels is carried out in the control unit of the changeover device.

* * * * *